United States Patent [19]

Nakai et al.

[11] Patent Number: 4,910,116

[45] Date of Patent: Mar. 20, 1990

[54] METHOD FOR RECORDING COLOR IMAGE BY VARYING SINGLE SOURCE EXPOSURE INTENSITY

[75] Inventors: Hitoshi Nakai; Makoto Suzuki, both of Nagoya, Japan

[73] Assignee: Brother Kogyo Kabushiki Kaisha, Aichi, Japan

[21] Appl. No.: 181,530

[22] Filed: Apr. 14, 1988

[30] Foreign Application Priority Data

Apr. 17, 1987 [JP] Japan ................................. 62-95988
Sep. 3, 1987 [JP] Japan ................................ 62-220944

[51] Int. Cl.$^4$ ......................... G03C 1/72; G03C 13/04
[52] U.S. Cl. ..................................... 430/138; 430/54; 430/139; 430/945
[58] Field of Search ................... 430/138, 139, 54, 945

[56] References Cited

U.S. PATENT DOCUMENTS

| 4,740,809 | 4/1988 | Yamamoto et al. | 355/27 |
| 4,782,003 | 11/1988 | Yoshihara | 430/138 |
| 4,788,126 | 11/1988 | Feldman et al. | 430/138 |

FOREIGN PATENT DOCUMENTS

| 249429 | 12/1987 | European Pat. Off. | 430/138 |
| 2113860 | 8/1983 | United Kingdom | 430/138 |

Primary Examiner—Paul R. Michl
Assistant Examiner—Patrick A. Doody
Attorney, Agent, or Firm—Oliff & Berridge

[57] ABSTRACT

A method for recording a color image having two or more hues is disclosed which comprises exposing to light from one light source a light-sensitive sheet having carried on the surface thereof a mixture containing, as a light-sensitive agent, two or more kinds of photocurable microcapsules which encapsulate different color formers therein and are sensitive to lights of different wave length regions from each other, with changing the exposure amount in conformity with image information to thereby selectively cure the microcapsules, wherein (i) said light-sensitive agent contains at least one kinds of photcurable microcapsules which become soft when light-exposed in an exposure amount more than the exposure amount necessary for photocuring of said one kind of photocurable microcapsules, or (ii) said exposing is carried out using one light source capable of emitting lights of said different wave length regions simultaneously with controlling the exposure amount within plural levels bonded by maximum sensitivity in each of said different wave length regions in a composite spectral sensitivity characteristic synergistically synthesized from spectral sensitivities of said two or more kinds of photocurable microcapsules and coefficient of spectral radiation of said one light source.

10 Claims, 7 Drawing Sheets

METHOD FOR RECORDING COLOR IMAGE BY VARYING SINGLE SOURCE EXPOSURE INTENSITY

FIELD OF THE INVENTION

This invention relates to a method for recording a color image of desired hues by scanning light on a light-sensitive sheet having provided thereon color former-containing photocurable microcapsules to selectively cure the microcapsules in conformity with image information and carrying out pressure development in the presence of a color developer.

BACKGROUND OF THE INVENTION

Hitherto in color printing of letters and figures various methods have been known for printing desired areas or letters in different color from those of other areas or letters, such as a wire dot printing method utilizing plural color ink ribbons wherein one ribbon of a desired color is given an impact by a pin head to transfer the color ink to a recording sheet; and a thermal transfer printing method utilizing plural color ink donor sheets wherein a color ink donor sheet is interposed between a thermal head and a recording sheet for each color and the ink is thermally transferred to the recording sheet. In either printing method, however, there are disadvantages, that in a plurality of color ink ribbons or color ink donor sheets are needed, the printing operation is repeated for each color so that the printing speed is slow, and in addition, ink is not efficiently used when letters are printed since ink on whole areas of color ink ribbons or color ink donor sheets is not transferred.

Other methods there are known such as an ink jet method by using plural color inks and jetting ink drops through a nozzle for every color ink so as to avoid color mixing, and an electro-photographic method wherein a latent image is formed on a photoreceptor by exposing to a laser beam modulated with image signals or light which is ON/OFF-controlled with a liquid crystal shutter (LCS). However, the former involves difficulties in controlling size of the ink drops and preventing clogging in the nozzles and further it requires complicated means for jetting ink drops to desired positions accurately. In the latter, the operation of light exposure and development must be repeated for every color so that a plurality of developing means are needed for the plurality of colors, and in turn a device for carrying out the electro-photographic method becomes large and expensive, and this method is still not free from color-mixing problem.

There is a method of recording color images by directly exposing to laser beams a light-sensitive sheet having uniformly coated thereon two or more kinds of photocurable microcapsules having sensitivity to light of different wave length regions in which different color formers are encapsulated (as described in Japanese Patent Application No. 175,897/86). The light-sensitive sheet is scanned with light signals, in conformity with image information, emitted from a plurality of laser beams of different wave length to which the microcapsules are sensitive and color images are formed upon pressure development in the presence of a color developer. According to this method a color image can be obtained with ease. However, this method still has the disadvantage that three independent laser beam sources having wave lengths corresponding to the three primary colors (R, G, B) are used. For such laser beam sources, gas lasers are used such as He-Cd$^+$ laser ($\lambda=441.6$ nm), Ar$^+$ laser ($\lambda=514.5$ nm) and He-Ne laser ($\lambda=632.8$ nm), but a large and expensive oscillator is needed for every gas laser as well as an audio-optical element (e.g., TeO$_2$) for modulation of every laser, and moreover three drive circuits are needed. Thus, the resulting recording device becomes complicated. In addition, the laser beams for the three primary colors passed through optical lenses, such as a beam combining lens and an f$\theta$ lens tend to be out of focus due to chromatic aberrations of glass, resulting in a degraded image quality.

SUMMARY OF THE INVENTION

An object of this invention is to provide a method for recording a color image of good quality, taking advantage of light-sensitive and pressure-sensitive recording techniques, yet one which is free from the aforesaid defects, e.g., no need to use a plurality of laser beam sources having different wave length but a small and economical laser beam source with a simplified optical system.

That is, this invention is a method for recording a color image having two or more hues which comprises exposing to light from one light source a light-sensitive sheet carrying on the surface thereof a mixture containing, as a light-sensitive agent, two or more kinds of photocurable microcapsules which encapsulate different color formers therein and are sensitive to light of different wave length regions from each other, with changing the exposure amount in conformity with image information to thereby selectively cure the microcapsules, wherein (i) said light-sensitive agent contains at least one kind of photocurable microcapsules which become soft when light-exposed in an exposure amount more than that necessary for photocuring of said one kind of microcapsules, or (ii) said exposing is carried out using one light source capable of emitting light of said different wave length regions simultaneously with controlling the exposure amount within plural levels bounded by maximum sensitivity in each of said different wave length region in a composite spectral sensitivity characteristic synergistically synthesized from spectral sensitivities of said two or more kinds of photocurable microcapsules and the coefficient of spectral radiation of said one light source.

DETAILED DESCRIPTION OF THE INVENTION

The light sensitive sheet which can be used in this invention may be either (1) a sheet having coated thereon a mixture of (i) three kinds of microcapsules encapsulating color formers (dye precursors) for a yellow dye, a magenta dye and a cyan dye, respectively, with hulls of photocurable resins which are ruptured with more than a certain degree of pressure and which have sensitivities to light of different wave length regions from each other, and (ii) a color developer which undergoes color developing reactions with the color formers; a so-called "self-color-forming type light-sensitive sheet", or (2) a so-called "separate type light-sensitive sheet" consisting of a sheet coated with a mixture of three kinds of microcapsules as described above and another sheet coated with a color developer, which are put face to face and pressure applied for color development.

Two or more kinds of photocurable microcapsules carried on the light-sensitive sheet used in this invention have different spectral sensitivities from each other, and such microcapsules can be easily obtained by properly selecting compositions of photocurable resins. For example, photocurable resin used in light-sensitive and pressure-sensitive sheets described in Japanese Patent Application (OPI) Nos. 88739/83 and 88740/83 satisfy the above property. (The term "OPI" means an unexamined and published patent application.) Photocurable and reversible microcapsules used in the first embodiment described below can also be obtained easily.

Further, it is well known to sensitize photocurable resins to light of longer wave length by addition of a small amount of dye such as cyanine dyes. Sensitization to light of any wave length ranging from 400 to 800 nm can be achieved without any difficulty by using a cyanine dye having the structure represented by the following formula and changing n of the $(-CH=CH-)_n$:

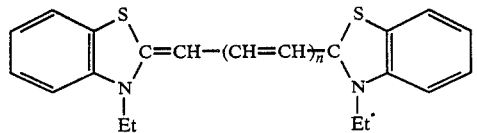

When the light-sensitive sheet coated with color former-encapsulated photocurable microcapsules is subjected to light-exposure with an exposure amount varied in accordance with image information, the microcapsules are selectively cured so that color developing reactions between the color former and a color developer take place only at desired areas.

One embodiment (first embodiment) of this invention incorporates as the light-sensitive agent at least one kind of photocurable microcapsules which become soft to show a reverse phenomenon when exposed to light in an exposure amount more than that necessary for photocuring of the microcapsules (herein merely referred to as "photocurable and reversible microcapsules").

Figure 1:
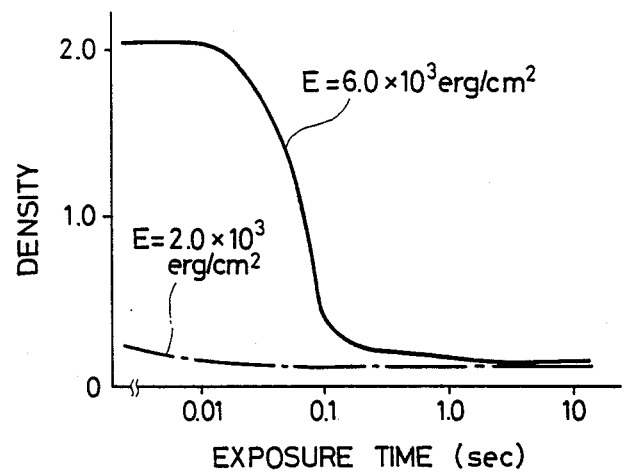
FIG. 1 shows reverse phenomenon of photocurable microcapsules used in the first embodiment of this invention.

While photocurable microcapsules are cured by light-exposure, certain photocurable microcapsules once cured become soft when applied an excess amount of light-exposure is applied. This phenomenon is due to common characteristic of photocurable resins and is presumably explained as follows: a monomeric photocurable resin becomes polymer when exposed to light, and when an excess amount of light-exposure is applied, the light energy is converted into heat with which the polymer chain is cut to a monomeric resin again similar to that in the initial stage. FIG. 1 shows a relationship between an exposure time, an exposure amount and a color density obtained upon pressure development with respect to photocurable microcapsules comprising a certain photocurable resin. It is seen from FIG. 1 that the density is below 0.1 with the exposure amount (E) of $2 \times 10^3$ $erg/cm^2$ for the exposure time of 0.01 to 10 sec, whereas with the larger exposure amount (E) of $6 \times 10^3$ $erg/cm^2$, the density gradually increases as the exposure time is reduced, showing the reverse phenomenon in the area below 100 msec.

The first embodiment of this invention is explained with reference to the drawings in more detail below.

Figure 2:
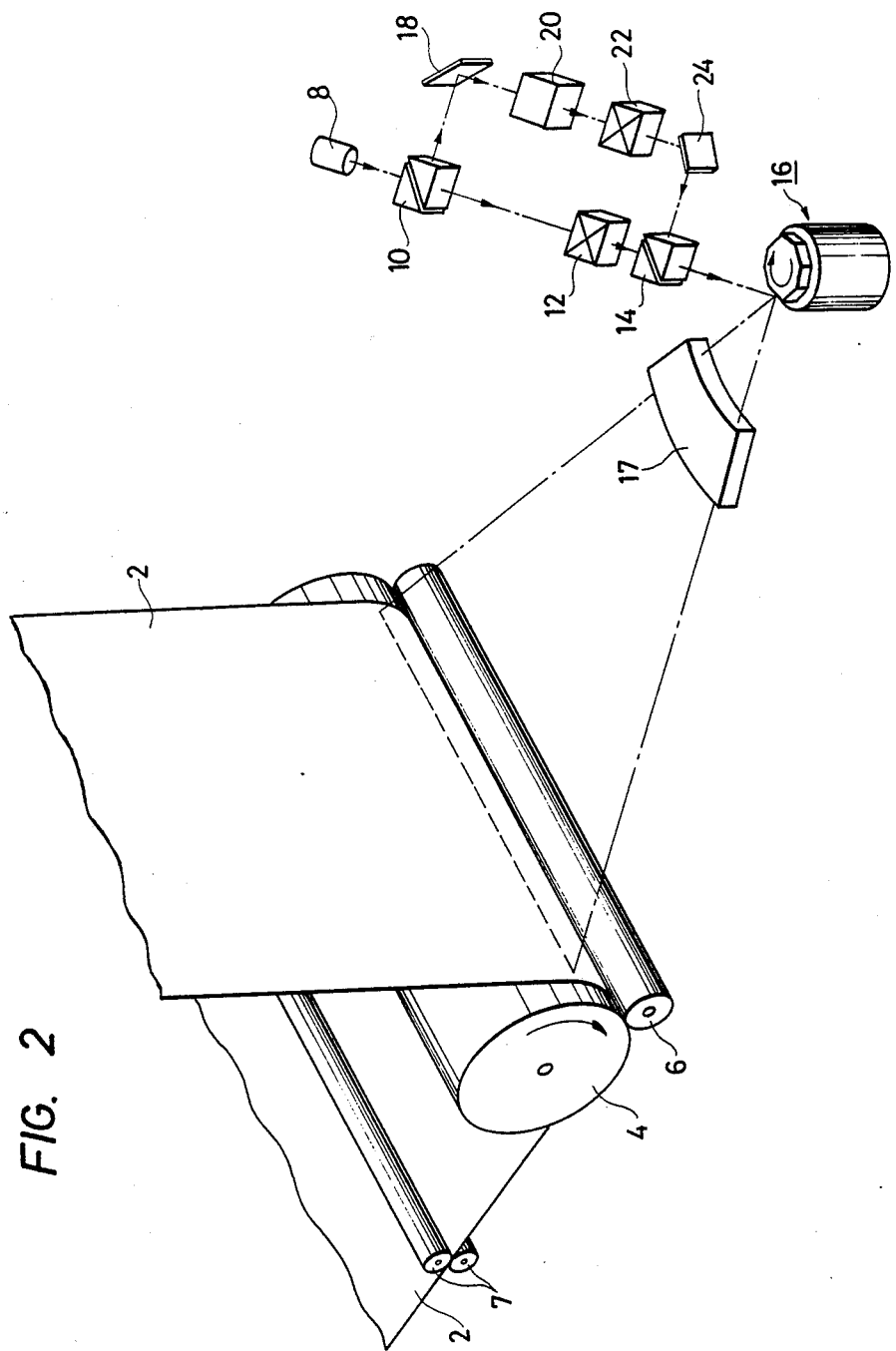
FIG. 2 shows the basic constitution of a light-sensitive and pressure-sensitive recording device used in the first embodiment.

FIG. 2 shows a perspective view of a light-sensitive and pressure-sensitive recording device with light-sensitive sheet 2 which are suitable for performing the method of this embodiment.

Figure 3:
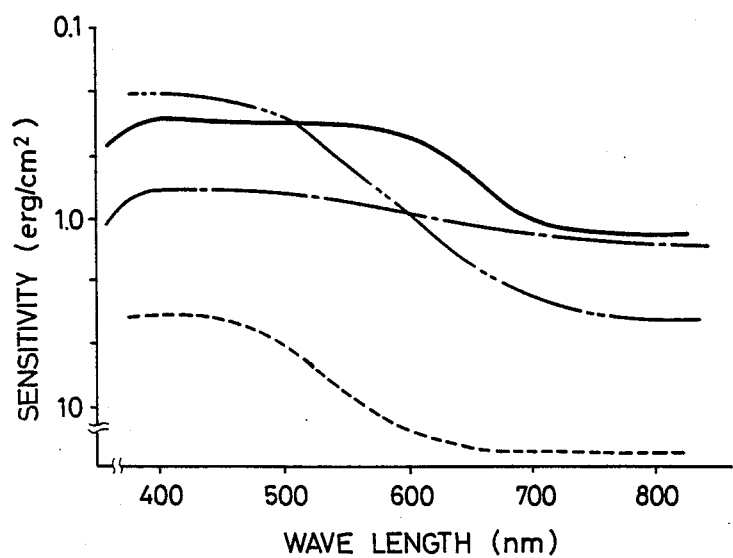
FIG. 3 shows spectral sensitivities of photocurable microcapsules carried on a light-sensitive sheet used in the first embodiment.

FIG. 3 shows spectral sensitivity characteristics of three kinds of photocurable microcapsules (Y, M and C) which have different spectral sensitivities from each other, carried on light-sensitive sheet 2, wherein the abscissa represents wave length (λ) and the ordinate represents sensitivity ($erg/cm^2$). In FIG. 3, the solid line, the one-dot broken line, and the two-dot broken line are sensitivity curves of photocurable microcapsules Y, M and C, respectively. In the case photocurable microcapsule Y has the reversible property, the chain line in the figure shows sensitivity of photocured microcapsule Y to be softened. Photocurable microcapsule Y remains uncured in the area beyond the sensitivity curve Y (solid line) in the figure (where a color developing reaction occurs upon pressure development in the presence of a color developer); it is cured in the area interposed between the sensitivity curve Y and the softening-sensitivity curve Y (chain line) (where no color developing reaction occurs); and it becomes soft in the area below the softening-sensitivity curve Y (where a color developing reaction occurs).

Figures 4, 5:
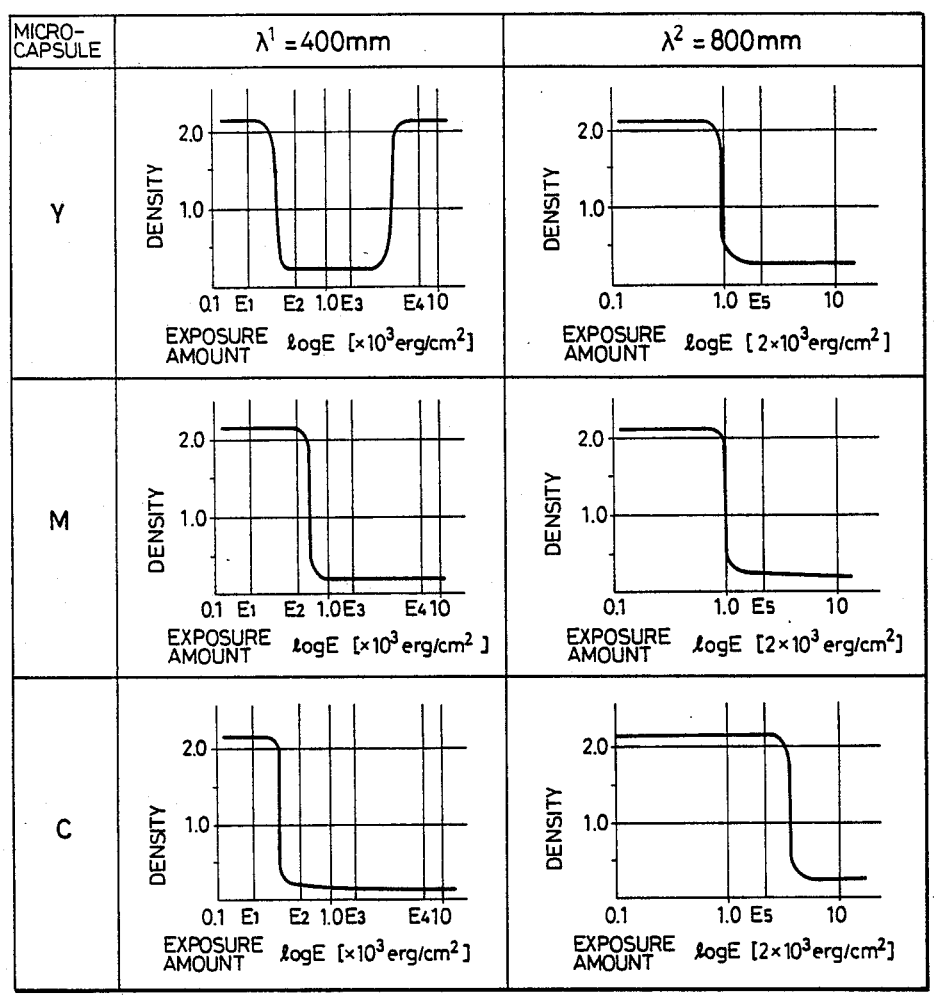
FIG. 4 show exposure amount/density relationships of the photocurable microcapsules of the first embodiment.
FIG. 5 shows a relationship between cured microcapsules and hues obtained upon color development by a combination of color formers encapsulated in the photocurable microcapsules according to the first embodiment.

FIG. 4 shows sensitometry curves of photocurable microcapsules Y, M and C, wherein the abscissa represents an exposure amount log E (erg/cm$^2$) applied to light-sensitive sheet 2 and the ordinate represents a color density (no unit) of dye derived from the color former encapsulated in each of photocurable microcapsules Y, M and C on light-sensitive sheet 2 when exposed and subjected to pressure development. The figure shows that photocurable microcapsule Y is cured by exposure to a laser beam having wave length of 400 nm ($\lambda_1$) in an exposure amount ranging from $E_2$ to $E_3$ so that the density after pressure development is as low as about 0.1, whereas the density is about 2.1 when exposed in the lower exposure amount $E_1$ since the microcapsule Y is not cured, when exposed in the exposure amount $E_4$ higher than that at which a photocuring reaction of the microcapsule Y occurs, however, the cured microcapsule again becomes soft, resulting in increase of the density to about 2.1. On the other hand, using a laser beam of wave length $\lambda_1$ photocurable microcapsules M and C are cured and provide the density of only about 0.1 at the exposure amounts of more than $E_3$ and more than $E_2$, respectively. When a laser beam having wave length of 800 nm ($\lambda_2$) is used, both photocurable microcapsules Y and M provide the density of about 0.1 at the exposure amount of more than $E_5$, whereas photocurable microcapsule C is still uncured at the exposure amount $E_5$ so that the density is as high as 2.1.

Color development of desired hues can be achieved by properly using color formers in combination to be encapsulated in the above photocurable microcapsules Y, M and C. FIG. 5 shows a relationship between hue and photocurable microcapsules to be cured so as to obtain the hue. That is, color formers encapsulated in cured microcapsules do not exude therefrom during pressure development, so that they do not participate in a color developing reaction with a color developer. Thus, the color development with a desired hue can be effected by selectively cure the microcapsules. Light-sensitive sheet 2 can provide five hues as shown in FIG. 5, including the three primary colors of coloring materials, i.e., cyan (C), magenta (M) and yellow (Y), which enable reproduction of full-color images by the combination thereof. Further, every combination of photocurable microcapsules to be cured for the reproduction of full-color images can be effected by using only two laser beams having a single wave length $\lambda_1$ (400 nm) and $\lambda_2$ (800 nmm), respectively. Half tone images can also be reproduced in the form of paragradation by applying to this invention a conventional area gradation method wherein light-exposure is ON/OFF-controlled for each lattice of matrix (n×m lattices). If one imaging element expressed by the matrix is 0.2 mm×0.2 mm in size and is to reproduce hue having a gradation number of 16, the matrix of 4×4 lattices can be applied therefor. In the case, the diameter of laser beam applied on the lattice of light-sensitive sheet 2 is about 50 μm, and laser beam of such a diameter can be easily obtained using conventional optical lenses.

Next, the light-sensitive and pressure-sensitive recording device illustrated in FIG. 2 is explained in detail, which is suitable for carrying out the first embodiment using light-sensitive sheet 2 described above.

Light-sensitive sheet 2 is fed into the device with platen 4 and sheet-feeding roll 6 and is subjected to light-exposure at the position closely contacted with platen 4 by laser beam scanned in the width direction of the sheet, followed by pressure development with pressure roll 7. The laser beam of 800 nm in wave length is emitted from AlGaAs/GaAs-series semiconductor laser-emitting element 8. The emitted laser is separated by beam spliter 10; one beam goes straight to reach polygon mirror 16 through first shutter 12 and beam synthesizer 14 and the other beam is reflected at reflection mirror 18, passed through second higher harmonics generator 20 to convert to a laser beam of 400 nm and second shutter 22, reflected at reflection mirror 24 and to beam synthesizer 14, from which the beam goes on the same light path as the other to polygon mirror 16. First and second shutters 12 and 22 are high-speed responsive mechanical shutters using piezoelectric elements as a driving source, and they operate in such a link motion that one shuts a laser beam when the other passes a laser beam, so that one of the 800 nm- and 400 nm-laser beams reaches polygon mirror 16.

Polygon mirror 16 (a regular octagonal mirror in FIG. 2) is rotated at a constant speed, whereby 800 nm- or 400 nm-laser beam is scanned horizontally through fθ lens 17 which makes the scanning speed constant on light-sensitive sheet 2, closely in contact with platen 4.

The thus constituted device makes it possible to expose photocurable microcapsules to a laser beam on the light-sensitive sheet at a desired position by modulation-oscillating of semiconductor laser element 8 according to image information, so that an desired position can be colored by pressure development with pressure roll 7. Moreover, by changing the wave length of a laser beam impinging on a desired position from 400 nm to 800 nm or vice versa by switching first shutter 12 or second shutter 22, and at the same time controlling the laser power as shown in FIG. 3 photocurable microcapsules Y, M, C on light-sensitive sheet 2 can be cured in any combination. Thus two laser beams of different wave length suffice for full-color image reproduction in this embodiment in contrast to conventional methods using three laser beams for the three primary colors, and in turn the resulting image has improved quality owing to the reduced chromatic aberration of optical lenses. Although light from one light source is separated to obtain two laser beams using second higher harmonics generator 20 in FIG. 2, the full-color image reproduction can also be achieved with one laser beam by using at least two kinds of photocurable and reversible microcapsules. Further, use of semiconductor laser element 8 enables control of light-exposure to be effected with simplified circuits in either pulse width modulation or power modulation as compared to use of gas laser, so that the optical system including a laser light source, a modulator and lens system, as a whole, can be made small and less expensive.

As described above, a semiconductor laser is preferably used in this embodiment but gas laser, for example Ar$^+$ laser may also be used since two wave length oscillations (514.5 nm and 457.9 nm) can be effected. In the case, the exposure amount can be controlled by adjusting the exposure time with a shutter provided in the light path.

The first embodiment of this invention has advantages that plural laser beam sources having different wave length and plural modulation elements are not needed in light-sensitive and pressure-sensitive recording and a small and economical laser beam source can be utilized instead, so that an optical system involved in the recording device can be simplified and an image of good quality can be obtained due to the reduced chromatic aberration of optical lenses.

Another embodiment (second embodiment) of this invention which makes it possible to simplify an optical system involved in light-sensitive and pressure-sensitive recording devices is to expose to light a light-sensitive sheet having two or more kinds of color former-encapsulated photocurable microcapsules sensitive to light of different wave length regions using one light source capable of emitting light of the different wave length regions simultaneously, with controlling the exposure amount within the levels bounded by maximum sensitivity in each of the different wave length regions in a composite spectral sensitivity characteristic synergistically synthesized from spectral sensitivities of the photocurable microcapsules and the coefficient of spectral radiation of the light source.

This embodiment is now explained with reference to the drawings in more detail below.

Figure 6:
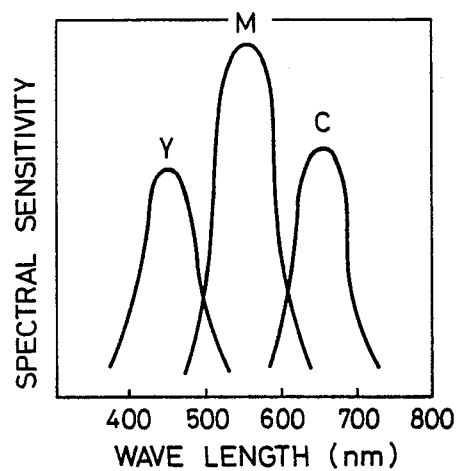
FIG. 6 shows spectral sensitivities of photocurable microcapsules on a light-sensitive sheet used in the second embodiment of this invention.
Figure 7A:
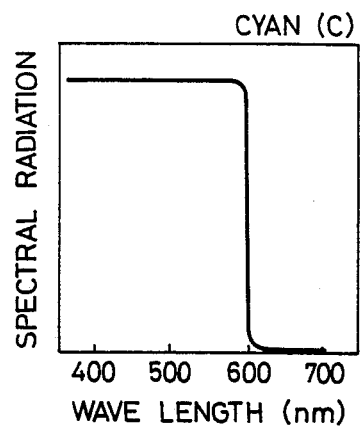
FIG. 7 shows spectral reflectances of cyan dye (C), magenta dye (M) and yellow dye (Y), respectively, carried and formed on the light-sensitive sheet upon color development.
Figure 7B:
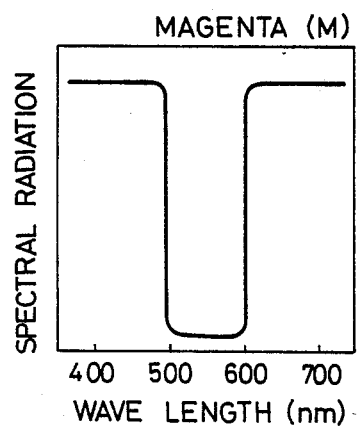
Figure 7C:
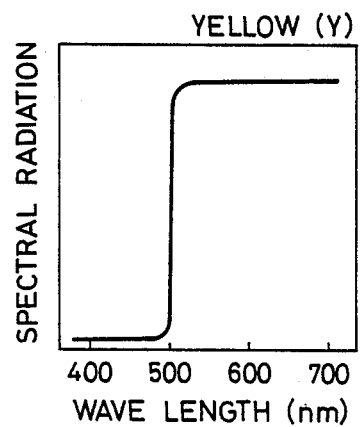

FIG. 6 shows spectral sensitivity characteristic of a light-sensitive sheet having photocurable microcapsules Y, M and C encapsulating a yellow dye precursor, a magenta dye precursor and a cyan dye precursor, respectively, used in this embodiment, wherein the sheet has maximum peaks at about 450 nm in the blue region B, about 550 nm in the green region G, and about 650 nm in the red region R, respectively, and FIG. 7 illustrates spectral reflectances of a cyan dye, a magenta dye and a yellow dye, respectively. In general, the spectral sensitivities of photocurable microcapsules Y, M and C are not the same as shown in FIG. 6. In this case the sensitivity decreases in the order of microcapsules M, C and then Y, and the photocuring reaction occurs with more light energy in this order.

Figure 8:
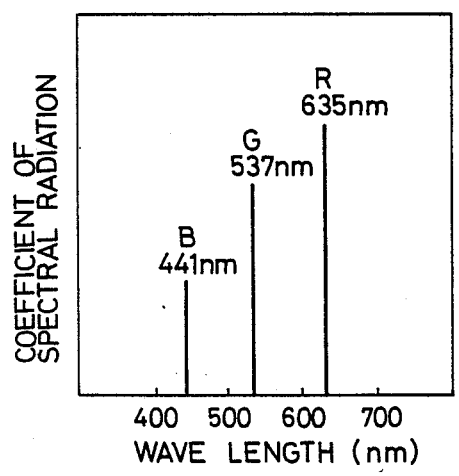
FIG. 8 shows a coefficient of spectral radiation of $He$-$Cd^+$ white laser used in the second embodiment.

In order to obtain a full-color image by one-shot exposure of the light-sensitive sheet to light, the light source used must simultaneously contain colored light falling within the different wave length regions to which photocurable microcapsules Y, M and C are sensitive. A laser light obtained from excitation of helium gas and cadmium ion (He-Cd+ laser) is known to have a spectrum mostly including light components of these three wave length regions. Namely, the laser light includes a blue light component (B) of 441 nm, a green light component (G) of 537 nm and a red light component (R) of 635 nm can be obtained by continuous oscillation of He-Cd+ at room temperature. FIG. 8 shows, as an example, a coefficient of spectral radiation at each light component of the laser light and the ratio of coefficient of spectral radiation in (R):(G):(B) is about 2:1.5:1.

Figure 9:
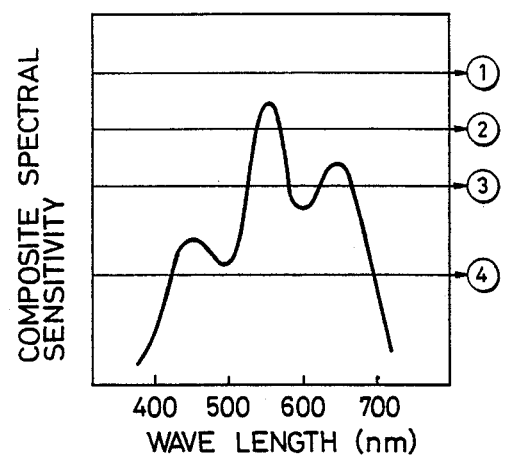
FIG. 9 shows a composite spectral sensitivity characteristic synergistically synthesized from spectral sensitivities of the light-sensitive sheet and coefficient of spectral radiation of the $He$-$Cd^+$ white laser.

In the case of exposing to He-Cd+ laser the light-sensitive sheet having the spectral sensitivity characteristic described above, a composite spectral sensitivity synergistically synthesized from the spectral sensitivities of the sheet and the coefficients of spectral radiation of the laser light with respect to each wave length region are as shown in FIG. 9, that is, the composite sensitivity of the system is high at the green region G and decreases in the order of R and then B. Therefore, controlling of the exposure amount in plural levels bounded by the maximum sensitivity in each of the wave length regions can selectively cure the microcapsules.

The plural levels of the exposure amount is explained with reference to ①, ②, ③ and ④ in FIG. 9 in detail below.

The exposure amount in level ① is too low to cure any of photocurable microcapsules C, M and Y having a cyan dye precursor, a magenta dye precursor and a yellow dye precursor, respectively, encapsulated therein, so that these uncured microcapsules are ruptured upon pressure development to allow the dye precursors to react with a color developer, whereby three colors (cyan, magenta, yellow) are formed in situ, appearing black due to substractive mixture of these three colors.

The exposure amount in level ② is sufficiently high to cure photocurable microcapsule M, but not C and Y, so that a cyan dye and a yellow dye are formed upon pressure development, appearing green.

The exposure amount in level ③ is sufficiently high to cure photocurable microcapsules M and C, so that the yellow dye precursor in uncured microcapsule Y reacts with a color developer upon pressure development to form a yellow dye.

The exposure amount in level ④ is sufficient to cure all of the microcapsules, so that the color developing reaction does not take place, showing color of the light-sensitive sheet as such (usually white).

As explained above, the light-sensitive sheet and white light source do not show flat spectra throughout the visible light region, and therefore at least three colors can be selectively obtained by one-shot exposure without color separation by controlling the exposure amount in several levels.

Figure 10:
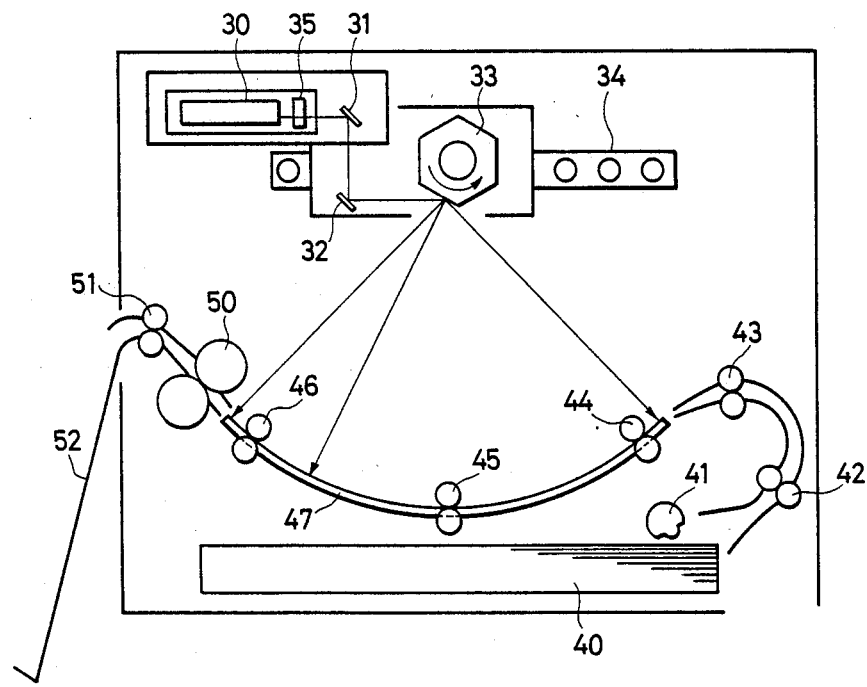
FIG. 10 shows the basic constitution of a recording device using the $He$-$Cd^+$ white laser as an example, for carrying out the second embodiment.

FIG. 10 shows the basic constitution of a recording device carrying out the second embodiment of this invention, which is composed of a laser scanner unit consisting mainly of He-Cd+ laser light source 30 and polygon mirror 33, self-color forming type light-sensitive sheet 40, conveying rolls 41 to 46 for the sheet, holder 47 supporting the light-sensitive sheet during light-exposure, pressure developing means 50, and the like. This device is operated as follows. White continuous light emitted from He-Cd+ laser light source 30 is passed through an optical system (not shown) to adjust the laser in a predetermined beam shape which is then modulated by audio-optical modulator 35 in conformity with image signals transmitted from a controller (not shown). The modulated light is polarized with plane mirrors 31 and 32 and polygon mirror 33 and scanned on holder 47 for light-exposure at a constant angular velocity. The laser scanner unit composed of laser light source 30 and polygon mirror 33 is driven on sliding unit 34 in the sheet-conveying direction (the laser sub-scanning direction perpendicular to the laser main-scanning direction) by a motor (not shown). Light-sensitive sheet 40 is taken out from a sheet cassette one by one with sheet-feeding roll 41 and conveyed with conveying rolls 42 to 46 pinching the edge portion of the sheet. After position of the sheet conveyed on holder 47 is detected by a sensor (not shown), the sheet is stopped at a predetermined position. Holder 47 has a certain curvature such that the linear velocity in the main-scanning direction of light beam on the sheet is constant. The thus exposed sheet is carried with conveying rolls 44 to 46 to a pair of pressure developing rolls 50, wherein uncured microcapsules are ruptured and the color developing reaction occurs as described above. Finally, the color-developed sheet is driven out to tray 52 with rolls 51.

The exposure amount of He-Cd+ laser can be freely changed at every area on the light-sensitive sheet in conformity with image information, to obtain desired colors, for example, by controlling the laser output, or while keeping the laser output constant, either providing in the light path a filter having several different light transmittances, or adjusting the sliding amount in the sub-scanning direction of the scanner unit in combination with control of the audio-optical modulator, e.g., sliding the scanner unit once to effect light-exposure (exposure time $T_1$) in the exposure amount within level ② in order to obtain green and sliding the scanner unit twice to effect light-exposure (exposure time $2 \times T_1$) in an exposure amount within level ③ for yellow. The second embodiment is not limited to these methods of controlling the exposure amount. To date, quick control of light output of He-Cd+ laser has been difficult, and the latter two methods are more practically employed in this embodiment.

Figure 11:
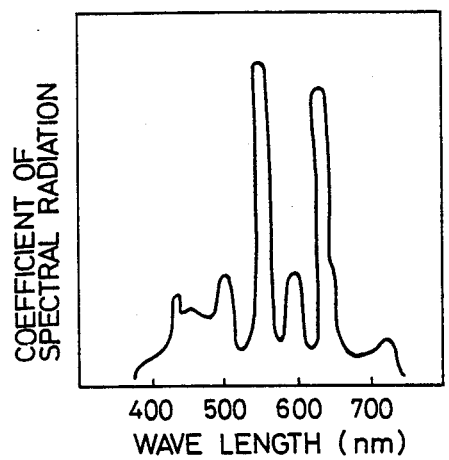
FIG. 11 shows a coefficient of spectral radiation of a fluorescent lamp emitting three-wave length light as another example.
Figure 12:
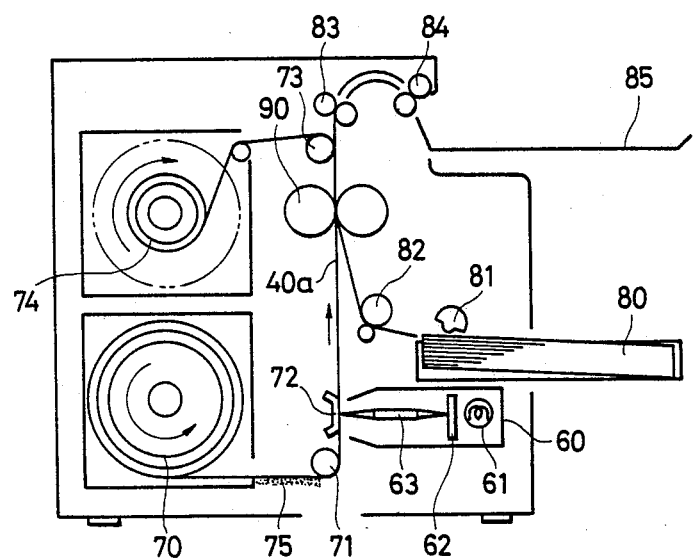
FIG. 12 shows the basic constitution of a recording device using the three-wave length fluorescent lamp.

FIG. 12 shows the basic constitution of another recording device for the second embodiment, composed of a cartridge 70 in which a roll of light-sensitive sheet 40a is mounted, holder 72 for exposure, a cartridge 74 for winding up the used sheet, light-exposure unit 60, straight-tube fluorescent lamp 61 emitting three-wave length light and capable of exposing the light-sensitive sheet in the entire width range, liquid crystal shutter (LCS) 62 and self-focus lens alley (SLA) 63, and in addition, color developer sheets 80, sheet-feeding rolls 81 to 84, a pair of pressure developing rolls 90 and tray 85 for receiving a color-developed sheet are provided in the device. Fluorescent lamp 61 exhibits coefficient of spectral radiation characteristic shown in FIG. 11, for example. This device is operated as follows. The roll-form light-sensitive sheet is drawn up from cartridge 70 by rolls 71 and 73 such a manner that the microcapsule-coated surface 75 of the sheet is held outward, and taken up in cartridge 74. LCS 62 is ON/OFF-controlled for every minimum imaging unit in the entire width range of the light-sensitive sheet by a controller (not shown) in conformity with image information, whereby light from fluorescent lamp 61 is focussed, through LCS 62 and SLA 63, on the light-sensitive surface of the sheet supported by holder 72. Since the ON/OFF time of LCS 62 can be adjusted for every minimum imaging element, the exposure amount on the light-sensitive surface can be changed in any of levels ① to ④ as shown in FIG. 8, and a desired color can be developed for every imaging unit. The exposed sheet is then brought in contact with color developer sheet 80 driven synchronously and subjected to pressure development by rolls 90 wherein uncured microcapsules are ruptured and the dye precursors encapsulated therein react with the color developer to form dyes. The thus color-developed sheet 80 is driven out to tray 85 by rolls 83 and 84.

This embodiment is explained with reference to concrete examples as described above, but the embodiment is not construed as being limited thereto. For example, the spectral sensitivities of photocurable microcapsules on the light-sensitive sheet and the coefficients of spectral radiation of light sources are not limited to those shown in FIGS. 6, 8 and 11, and in turn, the resulting composite spectral sensitivity characteristic is not limited to FIG. 9. Therefore, the relationship between the level of the exposure amount and the resulting color formed may vary. Further, the shutter used in the device shown in FIG. 12 may be a microshutter utilizing magnetic fluid in place of LCS.

According to this embodiment, photocurable microcapsules are selectively cured by controlling the exposure amount utilizing the difference of the composite spectral sensitivity with respect to each sensitive wave length region, and a color image having two or more hues can be obtained by one shot-exposure from a single light source and with one developing means. Thus the recording device can be made compact and simple.

What is claimed is:

1. A method for recording a color image having two or more hues which comprises, exposing to light from one light source a light-sensitive sheet carrying on a surface thereof a mixture containing, as a light-sensitive agent, two or more kinds of photocurable microcapsules which encapsulate different color formers therein and are sensitive to light of different wavelength regions from each other; changing the exposure amount in conformity with image information to thereby selectively cure the microcapsules; and wherein said light-sensitive agent contains at least one kind of photocurable microcapsules which become soft when light-exposed in an exposure amount more than the exposure amount necessary for photocuring of said one kind of photocurable microcapsules.

2. A method for recording a color image as claimed in claim 1, wherein said light-sensitive agent contains three kinds of photocurable microcapsules having sensitivity to light of different wave length regions.

3. A method for recording a color image as claimed in claim 2, wherein said three kinds of photocurable microcapsules contain a cyan dye precursor, a magenta dye precursor and a yellow dye precursor, respectively.

4. A method for recording a color image as claimed in claim 2, wherein said three kinds of photocurable microcapsules are sensitive to a red light region, a green light region and a blue light region.

5. A method for recording a color image as claimed in claim 1, wherein said light-sensitive agent contains a photocurable microcapsule sensitive to a red light region and encapsulating a cyan dye precursor, a photocurable microcapsule sensitive to a green light region and encapsulating a magenta dye precursor, and a photocurable microcapsule sensitive to a blue light region and encapsulating a yellow dye precursor.

6. A method for recording a color image having two or more hues which comprises, exposing to light from one light source a light-sensitive sheet carrying on a surface two or more kinds of photocurable microcapsules which encapsulate different color formers therein and are sensitive to light of different wavelength regions from each other; changing the exposure amount in conformity with image information to thereby selectively cure the microcapsules; and wherein said exposing is carried out using one light source capable of emitting light of said different wavelength regions simultaneously and controlling the exposure amount within plural levels bounded by maximum sensitivity in each of said different wavelength regions in a composite spectral sensitivity characteristic synergistically synthesized from spectral sensitivities of said two or more kinds of photocurable microcapsules and the coefficient of spectral radiation of said one light source.

7. A method for recording a color image as claimed in claim 6, wherein said light-sensitive agent contains three kinds of photocurable microcapsules having sensitivity to lights of different wave length regions.

8. A method for recording a color image as claimed in claim 7, wherein said three kinds of photocurable microcapsules contain a cyan dye precursor, a magenta dye precursor and a yellow dye precursor, respectively.

9. A method for recording a color image as claimed in claim 7, wherein said three kinds of photocurable microcapsules are sensitive to a red light region, a green light region and a blue light region.

10. A method for recording a color image as claimed in claim 6, wherein said light-sensitive agent contains a photocurable microcapsule sensitive to a red light region and encapsulating a cyan dye precursor, a photocurable microcapsule sensitive to a green light region and encapsulating a magenta dye precursor, and a photocurable microcapsule sensitive to a blue light region and encapsulating a yellow dye precursor.

* * * * *